United States Patent [19]

Zolotenko et al.

[11] 4,268,795
[45] May 19, 1981

[54] PULSED VOLTAGE AMPLIFICATION DEVICE WITH DRIFT CORRECTION

[76] Inventors: Vladimir A. Zolotenko, 2 Detsky proezd, 2, kv. 18; Vladimir V. Pavlov, ulitsa Sovetskaya, 21, kv. 56; Viktor E. Sokolov, ulitsa Shelkovichnaya, 194, kv. 49; Alexei N. Syromyatnikov, ulitsa Pushkina, 17/25, kv. 66, all of Saratov, U.S.S.R.

[21] Appl. No.: 951,833

[22] Filed: Oct. 16, 1978

[30] Foreign Application Priority Data

Jan. 24, 1978 [SU] U.S.S.R. .............................. 2564817

[51] Int. Cl.³ .............................................. H03F 1/02
[52] U.S. Cl. .......................................... 350/9; 330/85
[58] Field of Search ..................... 330/9, 69, 85, 109

[56] References Cited

U.S. PATENT DOCUMENTS 3,432,763  3/1969  Ingman .............................. 330/85 X
4,039,963  8/1977  Guillon et al. .......................... 330/9

*Primary Examiner*—James B. Mullins
*Attorney, Agent, or Firm*—Fleit & Jacobson

[57] ABSTRACT

A pulsed voltage amplification device with drift correction comprises a main differential amplifier whose non-inverting input is coupled to a pulsed voltage source, this main differential amplifier being provided with a pulsed feedback circuit coupled to the output and the inverting input of the main differential amplifier, and a memory capacitor coupled to the inverting input of the main differential amplifier. The pulsed feedback circuit comprises an additional differential amplifier, having its non-inverting input coupled to the output of the main differential amplifier, and a diode connected in series with the additional differential amplifier and coupled to the inverting input of the main differential amplifier. The operation cf the proposed device in conjunction with various amplitude analyzers makes it possible to enhance the validity and accuracy of the analysis results, to simplify circuit requirements and to increase circuit reliability.

3 Claims, 1 Drawing Figure

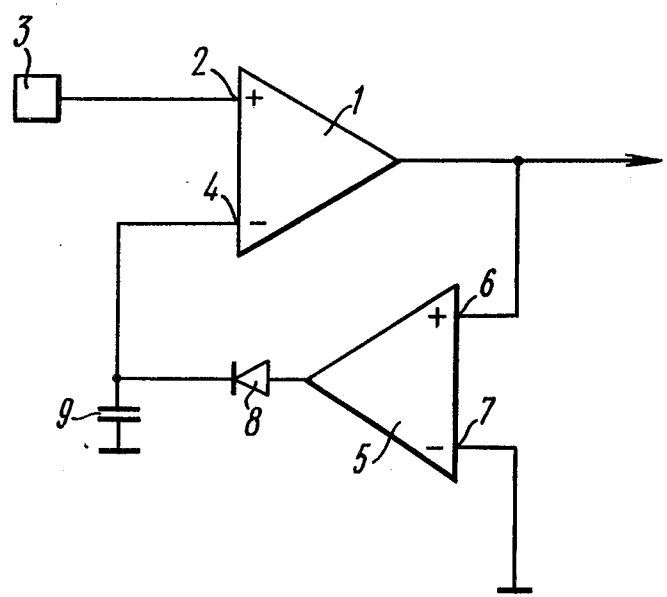

PULSED VOLTAGE AMPLIFICATION DEVICE WITH DRIFT CORRECTION

FIELD OF THE INVENTION

The invention relates to measurement techniques, and more particularly to pulsed voltage amplification devices with drift correction.

The invention is applicable for use with devices for precise fixation of signal levels for amplification of unipolar pulsed signals and with devices in which the recovery of the d.c. component of the signal is accomplished.

The invention is especially suitable for use with amplitude analyzers for amplification of unipolar pulsed signals.

DESCRIPTION OF THE PRIOR ART

When pulsed signals are subject to amplitude analysis, it is necessary that the amplitude of each pulse can be discriminated accurately. The accuracy of the amplitude discrimination is determined by the drift of the zero level of the output of the amplifier. The magnitude of the drift depends on the value of the inherent zero shift of the amplifier, on the stability of the supply voltage, on the ambient temperature, on time, etc.

Known in the art is a pulsed voltage amplification device with drift correction (cf. the USSR Inventor's Certificate No. 294,246, Int. Cl. HO3k, 5/20), comprising a main differential amplifier having its non-inverting input coupled, via a first switch, to a pulsed voltage source, and having a pulsed voltage feedback circuit connected to its output and its inverting input, and a memory capacitor coupled to the inverting input of the main differential amplifier. Another pulse voltage source is coupled, via a second switch, to the inverting input of the main differential amplifier. The inputs of the main differential amplifier are jointed together via a third switch. The pulsed feedback circuit comprises a switch coupled to the output of the main differential amplifier, and a voltage-type follower connected in series with the switch and coupled to the inverting input of the main differential amplifier.

In the described device, the drift is corrected by making the switch in the pulsed feedback circuit with the result that the drift voltage is applied to the memory capacitor from the output of the main differential amplifier. In this case, the pulsed voltage sources are disconnected from the inputs of the main differential amplifier and these inputs connect each other.

The periodical disconnection of the pulsed voltage sources results in a partial loss of data on input signals; for example, some pulses are lost when the described device is used for amplitude analysis of pulsed signals.

In addition, the availability of a number of switches and their respective control unit makes the circuitry of the device a rather complicated one.

SUMMARY OF THE INVENTION

An object of the invention is to provide for a continuous correction of the drift of the zero output level of a pulsed voltage amplification device.

Another object of the invention is to provide for a pulsed voltage amplification device with drift correction offering a higher reliability.

There is disclosed a pulsed voltage amplification device with drift correction, comprising a main differential amplifier having its non-inverting input coupled to a pulsed voltage source, and having a pulsed feedback circuit coupled to the output and the inverting input of the main differential amplifier, and a memory capacitor coupled to the inverting input of the main differential amplifier, which device comprises, according to the invention, an additional differential amplifier incorporated in the pulsed feedback circuit, the non-inverting input of the additional differential amplifier being coupled to the output of the main differential amplifier, and a diode incorporated in the pulsed feedback circuit, said diode being connected in series with the additional differential amplifier and coupled to the inverting input of the main differential amplifier.

The operation of the proposed device in conjunction with various amplitude analyzers makes it possible to enhance the validity and accuracy of the analysis results, to simplify circuit requirements and to increase circuit reliability.

DESCRIPTION OF THE DRAWING

The invention will now be described, by way of example, with reference to the accompanying drawing showing a circuit diagram of a pulsed amplification device with drift correction, according to the invention.

DESCRIPTION OF THE INVENTION

Described below is an embodiment of the proposed device used to amplify unipolar negative pulsed signals.

The device of the invention comprises a main differential amplifier 1 having its non-inverting input 2 coupled to a pulsed voltage source 3. The latter is a photoelectric transducer which converts the size of the particles in a gaseous flow to negative electric pulses. Use may also be made of any source providing unipolar negative pulses. The main differential amplifier 1 has a pulsed feedback circuit coupled to its output and to its inverting input 4. The pulsed feedback circuit also comprises an additional differential amplifier 5 whose non-inverting input 6 is coupled to the output of the main differential amplifier 1 and whose inverting input 7 is grounded. The output of the additional differential amplifier 5 is coupled to a diode 8 which is connected to an inverting input 4 of the main differential amplifier 1. A memory capacitor 9 is inserted between the inverting input 4 of the main differential amplifier 1 and the ground. The gain of the main differential amplifier 1 is selected depending on the required amplification of the pulsed voltage. The gain of the additional differential amplifier 5 is calculated using the allowable drift value for the zero output level of the device and the value of the cutoff voltage of the diode 8. The output of the main differential amplifier 1 is the device output.

The device of the invention operates in the following manner. During the period of application of a negative pulse from the pulsed voltage source 3 to the non-inverting input 2 of the main differential amplifier 1, the memory capacitor 9 is charged via the internal resistor of the main differential amplifier 1. The time constant of the charging circuit of the memory capacitor 9 considerably exceeds the pulse duration and the memory capacitor 9 assumes a voltage corresponding to some portion of the pulse amplitude. The output of the main differential amplifier 1 produces an amplified negative pulse which is further amplified by the additional differential amplifier 5 and drives the diode 8 to cutoff. The pulsed feedback circuit is disabled for as long as the negative pulse is present. After the application of the pulse is terminated, the memory capacitor 9 begins to discharge via the internal resistor of the main differential amplifier 1. The polarity of the voltage being applied between the inverting input 4 and the non-inverting input 2 of the main differential amplifier 1 during the discharge period of the memory capacitor 9 is such that the output of the latter produces a positive voltage. This voltage, after amplification in the additional differential amplifier 5, tends to drive the diode 8 to conduction with the result that the memory capacitor 9 is recharged and assumes a voltage whose absolute value is close to that of the drift voltage for the zero output level of the main differential amplifier 1, referred to the input of the latter. In this case, the voltage across the output of the main differential amplifier 1 is determined by a condition resulting from the presence of the drift voltage at the inverting input 4 of the main differential amplifier 1 and the voltage across the memory capacitor 9. The value of the voltage across the output of the main differential amplifier 1 is determined by the cutoff voltage of the diode 8 and the gain of the additional differential amplifier 5. For example, with the cutoff voltage of the diode 8 equal to 0.5 V and with the gain of the additional differential amplifier 5 equal to 1000, the drift voltage across the output of the main differential amplifier 1 equals 0.5 mV.

When the device of the invention is used to amplify unipolar positive pulsed signals, it is necessary to reverse the polarity of the diode 8. The operation of the device is similar, in this case, to that described above.

What is claimed is:

1. A pulsed voltage amplification device with drift correction, comprising:

a first differential amplifier having an inverting input, a non-inverting input, and an output;

pulsed voltage source means coupled to said non-inverting input of said first differential amplifier for providing pulsed signals thereto, said first differential amplifier providing amplified output pulses at said output of said first differential amplifier;

a pulsed feedback circuit connecting said output of said first differential amplifier to said inverting input of said first differential amplifier;

said pulsed feedback circuit including a second differential amplifier having a non-inverting input, a grounded inverting input, and an output;

said second differential amplifier having its non-inverting input coupled to said output of said first differential amplifier;

said pulsed feedback circuit further comprising diode switch means for switchably connecting said output of said second differential amplifier to said inverting input of said first differential amplifier; and a memory capacitor having a first plate and a second grounded plate, said first plate being coupled to said inverting input of said first differential amplifier and to said diode switch means;

said diode switch means being responsive to each of said amplified output pulses at the output of said first differential amplifier for switchably disconnecting said output of said second differential amplifier from said inverting input of said first differential amplifier, whereby to disable the feedback circuit during the time of occurrence of each of said amplified output pulses at the first differential amplifier output.

2. The device of claim 1, wherein said pulsed voltage source means comprises a photoelectric transducer for converting the size of particles in a gaseous flow to negative electric pulses.

3. The device of claim 1, wherein said pulsed voltage source means comprises a source providing unipolar negative pulses.

* * * * *